US012690347B2

(12) United States Patent
Yun

(10) Patent No.: US 12,690,347 B2
(45) Date of Patent: Jul. 21, 2026

(54) DISPLAY DEVICE

(71) Applicant: LG DISPLAY CO., LTD., Seoul (KR)

(72) Inventor: JaeKyeong Yun, Gyeonggi do (KR)

(73) Assignee: LG DISPLAY CO., LTD., Seoul (KR)

( * ) Notice: Subject to any disclaimer, the term of this patent is extended or adjusted under 35 U.S.C. 154(b) by 492 days.

(21) Appl. No.: 18/449,740

(22) Filed: Aug. 15, 2023

(65) Prior Publication Data

US 2024/0215357 A1 Jun. 27, 2024

(30) Foreign Application Priority Data

Dec. 22, 2022 (KR) ........................ 10-2022-0182164

(51) Int. Cl.
H01L 29/08 (2006.01)
H10K 59/131 (2023.01)
(52) U.S. Cl.
CPC ................................ H10K 59/131 (2023.02)
(58) Field of Classification Search
CPC ...... H10K 59/131; H10K 50/13; H10K 50/15; H10K 50/16; H10K 50/17; H10K 50/19; H10K 50/81; H10K 50/822; H10K 59/122; H10K 59/126; H10K 71/12; H10K 71/16; H10K 59/12; H10K 59/124; H10K 59/35; H10K 59/40; H10K 50/805; H10K 59/65; H10K 50/82; H10K 59/351; H10K 59/60; H10K 59/352; H10K 2102/341; H10K 50/84; H10K 59/30; H10K 59/86; H10K 59/875; H10K 10/82; H10K 50/115; H10K 59/10
See application file for complete search history.

(56) References Cited

U.S. PATENT DOCUMENTS

| | | | | |
|---|---|---|---|---|
| 10,923,546 | B2 * | 2/2021 | Park | H10K 59/1315 |
| 2011/0254757 | A1 * | 10/2011 | Kim | H10K 59/1315 |
| | | | | 345/76 |
| 2013/0009162 | A1 * | 1/2013 | Kang | H10K 59/8722 |
| | | | | 257/E51.005 |
| 2019/0088730 | A1 * | 3/2019 | Lee | H10K 59/1275 |
| 2019/0140039 | A1 * | 5/2019 | Lee | H10K 59/131 |
| 2019/0206973 | A1 * | 7/2019 | Kim | H10K 50/131 |
| 2020/0168688 | A1 * | 5/2020 | Lee | H10K 59/126 |
| 2020/0212146 | A1 * | 7/2020 | Shin | H10K 59/131 |

(Continued)

FOREIGN PATENT DOCUMENTS

| | | |
|---|---|---|
| KR | 20000027711 A | 5/2000 |
| KR | 20080027118 A | 3/2008 |
| KR | 10-2014-0080231 | 6/2014 |

(Continued)

*Primary Examiner* — Niki H Nguyen
(74) *Attorney, Agent, or Firm* — PnK IP LLC

(57) ABSTRACT

A display device includes a substrate including a display area in which a plurality of subpixels are disposed and a non-display area surrounding the display area, an external line and a first sub-diode, which are formed in the non-display area, and a light emitting element formed in each of the plurality of subpixels, wherein the first sub-diode includes a first sub-electrode, an organic layer and a second sub-electrode, the light emitting element includes a first electrode, a light emitting layer and a second electrode, the first sub-electrode is connected to the external line, and the second sub-electrode is connected to the second electrode.

12 Claims, 5 Drawing Sheets

(56)  References Cited

U.S. PATENT DOCUMENTS

2024/0074238 A1* 2/2024 Shin ................. H10K 59/8792

FOREIGN PATENT DOCUMENTS

| | | |
|---|---|---|
| KR | 10-2015-0037278 | 4/2015 |
| KR | 10-2018-0066320 | 6/2018 |
| KR | 10-2019-0066805 | 6/2019 |
| KR | 10-2019-0081953 | 7/2019 |

* cited by examiner

DISPLAY DEVICE

CROSS-REFERENCE TO RELATED APPLICATION

This application claims the benefit of the Korean Patent Application No. 10-2022-0182164 filed on Dec. 22, 2022, which is hereby incorporated by reference in its entirety.

BACKGROUND

Field of the Disclosure

The present disclosure relates to a display device.

Description of the Background

With the advancement of the information age, the demand for a display device for displaying an image has increased in various forms. Therefore, various types of display devices such as a liquid crystal display (LCD) device, a plasma display panel (PDP) device and an electroluminescence display (ELD) device have been recently used. The electroluminescence display device may include an organic light emitting display (OLED) device and a quantum-dot light emitting display (QLED) device.

Among the display devices, the electroluminescence display device is a self-light emitting type and has advantages in that a viewing angle and a contrast ratio are more excellent than those of the liquid crystal display (LCD) device. Also, since the electroluminescence display device does not require a separate backlight, it is advantageous that the electroluminescence display device is able to be thin and lightweight and has low power consumption. Further, the electroluminescence display device has advantages in that it may be driven at a direct current low voltage, has a fast response speed and has a low manufacturing cost. Particularly, studies for preventing inflow of static electricity from the outside are ongoing.

SUMMARY

Accordingly, the present disclosure is directed to a display device that substantially obviates one or more of problems due to limitations and disadvantages described above.

More specifically, the present disclosure is to provide a display device that can prevent inflow of static electricity from the outside.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device includes a substrate including a display area in which a plurality of subpixels are disposed and a non-display area surrounding the display area, an external line and a first sub-diode, which are formed in the non-display area, and a light emitting element formed in each of the plurality of subpixels, wherein the first sub-diode includes a first sub-electrode, an organic layer and a second sub-electrode, the light emitting element includes a first electrode, a light emitting layer and a second electrode, the first sub-electrode is connected to the external line, and the second sub-electrode is connected to the second electrode.

It is to be understood that both the foregoing general description and the following detailed description are exemplary and explanatory and are intended to provide further explanation of the disclosure as claimed.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
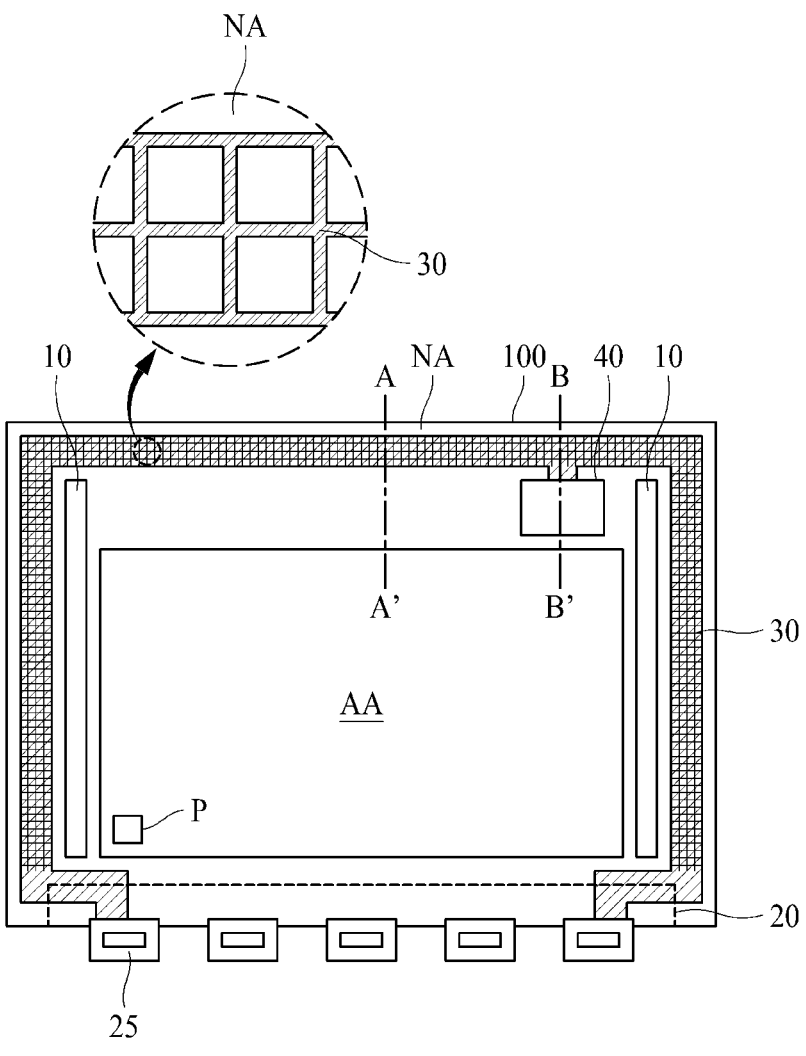
FIG. 1 is a plan view illustrating a display device according to an aspect of the present disclosure.

Advantages and features of the present disclosure and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing aspects of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another portion may be added unless 'only~' is used. The terms of a singular form may include plural forms unless referred to the contrary.

In construing an element, the element is construed as including an error band although there is no explicit description.

In describing a position relationship, for example, when the position relationship is described as 'upon~', 'above~', 'below~' and 'next to~', one or more portions may be disposed between two other portions unless 'just' or 'direct' is used.

In describing a temporal relationship, for example, when the temporal order is described as "after," "subsequent,"

"next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other and may be variously inter-operated with each other and driven technically as those skilled in the art may sufficiently understand. The aspects of the present disclosure may be carried out independently from each other or may be carried out together in a co-dependent relationship.

Hereinafter, the aspects of the present disclosure will be described in detail with reference to the accompanying drawings.

FIG. 1 is a plan view illustrating a display device according to one aspect of the present disclosure.

Referring to FIG. 1, a display device according to one aspect of the present disclosure may include a display area AA and a non-display area NA on a substrate 100.

A plurality of subpixels P may be formed in the display area AA. Each of the plurality of subpixels P may include a driving circuit and a light emitting element.

In the non-display area NA, a gate driver GIP 10, a pad portion PD 20, a ground line GND 30 and an anti-electrostatic discharge portion ESD 40 may be formed.

The gate driver 10 may apply a gate driving signal to the display area AA. Referring to FIG. 1, the gate driver 10 is formed at both sides of the display area AA, but is not limited thereto. The pad portion 20 may be provided with a chip-on-film 25, and may supply a data signal and a power source, which are applied through the chip-on-film 25, to the display area AA. Referring to FIG. 1, the pad portion 20 is formed below the display area AA, but is not limited thereto.

The ground line 30 is made of a conductive material, and may be formed to surround the edge of the display device. In detail, the ground line 30 may be formed to surround the display area AA and the gate driver 10, and both ends of the ground line 30 may be connected to the chip-on-film 25. In addition, the ground line 30 may be formed in a mesh shape. That is, the ground line 30 may include a plurality of lines formed in a horizontal direction and a vertical direction and may connected to each other while crossing each other. Therefore, static electricity introduced from the outside may be dispersed in the ground line 30. As a result, static electricity introduced from the outside may be dissipated or easily discharged to the outside, whereby static electricity may be prevented from flowing into the display area AA and the gate driver 10.

Also, in the present disclosure, the anti-electrostatic discharge portion 40 may be formed in the non-display area NA, whereby a driving element of the display area AA and the gate driver 10 may be further prevented from being damaged by static electricity introduced from the outside. The anti-electrostatic discharge portion 40 may be formed between the ground line 30 and the display area AA, and may be connected to the ground line 30. That is, any one of a plurality of lines constituting the ground line 30 may be extended toward the display area AA, and thus the ground line 30 and the anti-electrostatic discharge portion 40 may be electrically connected to each other. Referring to FIG. 1, one anti-electrostatic discharge portion 40 is shown, but is not limited thereto. That is, a plurality of anti-electrostatic discharge portions 40 may be formed.

Figure 2:
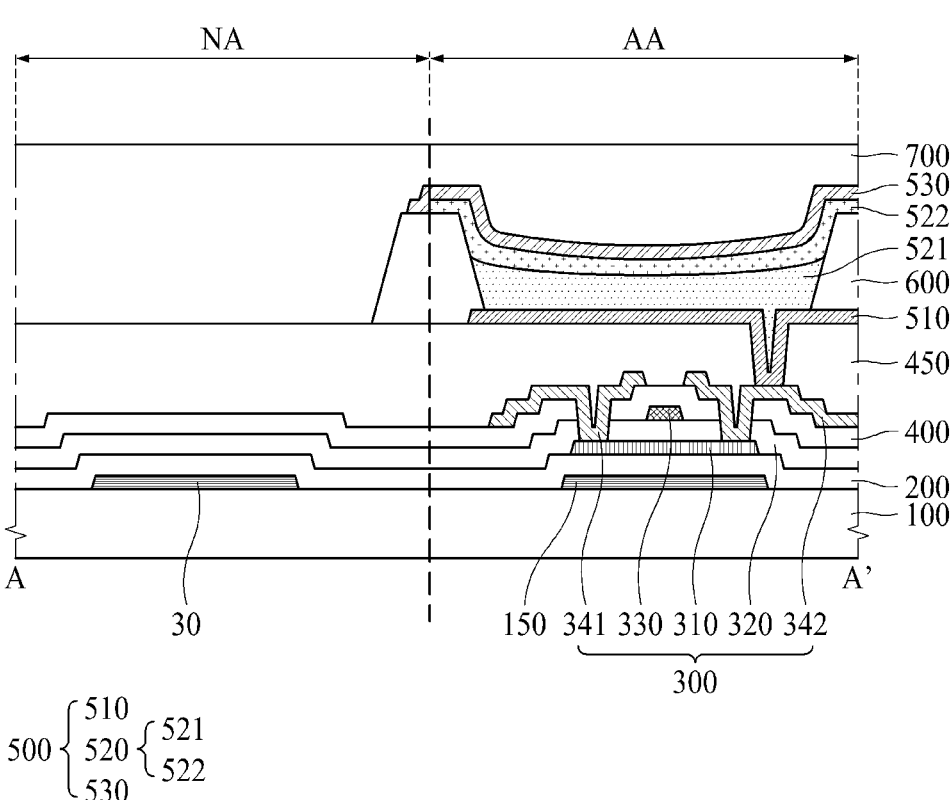
FIG. 2 is a cross-sectional view taken along line A-A' of a display device according to an aspect of the present disclosure.
Figure 3:
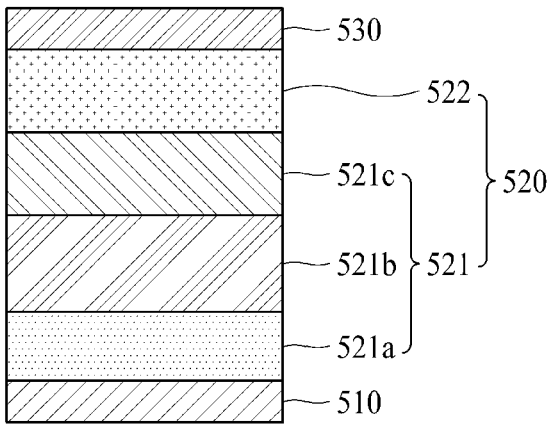
FIG. 3 is a cross-sectional view illustrating a light emitting element of a display device according to an aspect of the present disclosure.

FIG. 2 is a cross-sectional view taken along line A-A' of a display device according to one aspect of the present disclosure, and FIG. 3 is a cross-sectional view illustrating a light emitting element 500 of a display device according to one aspect of the present disclosure.

Referring to FIG. 2, the display device according to one aspect of the present disclosure may include a substrate 100 provided with a display area AA and a non-display area NA.

The substrate 100 may be made of glass or plastic, but is not limited thereto. The display device according to one aspect of the present disclosure may be provided in a top emission method in which emitted light is emitted toward an upper portion. Therefore, an opaque material as well as a transparent material may be used as the material of the substrate 100.

A blocking layer 150, a buffer layer 200, a thin film transistor 300, an interlayer insulating layer 400, a planarization layer 450, a light emitting element 500, a bank 600 and an encapsulation layer 700 may be formed in the display area AA.

The blocking layer 150 is formed on the substrate 100, and may include a conductive material capable of blocking light. For example, the blocking layer 150 may include a metal material such as aluminum (Al), silver (Ag), copper (Cu), molybdenum (Mo), titanium (Ti), tungsten (W) and chromium (Cr) or their alloy. In addition, the blocking layer 150 is shown as a single layer, but may be formed as a multi-layer. For example, the blocking layer 150 may be formed as a double layer, and the double layer may be comprised of a lower layer and an upper layer, which include their respective materials different from each other. In this case, the lower layer may be made of a molybdenum-titanium alloy (MoTi), and the upper layer may be made of copper (Cu), but the present disclosure is not limited thereto.

The buffer layer 200 may be formed on the substrate 100 to cover the blocking layer 150. The buffer layer 200 may include silicon nitride (SiNx) or silicon oxide (SiOx). In addition, the buffer layer 200 is shown as a single layer, but may be formed of a multi-layer. The buffer layer 200 insulates the blocking layer 150, and may improve adhesion between layers formed on the buffer layer 200 and the substrate 100.

The thin film transistor 300 may be formed on the buffer layer 200. In addition, the thin film transistor 300 may be disposed at a position overlapped with the blocking layer 150. Therefore, since the blocking layer 150 is disposed below the thin film transistor 300, external light may be prevented from affecting the thin film transistor 300, whereby reliability of the thin film transistor 300 may be improved.

The thin film transistor 300 may include a semiconductor layer 310, a gate insulating layer 320, a gate electrode 330, a source electrode 341 and a drain electrode 342.

The semiconductor layer 310 of the thin film transistor 300 may be formed on the buffer layer 200. The semiconductor layer 310 may include a poly-silicon semiconductor or an oxide semiconductor. When the semiconductor layer 310 includes an oxide semiconductor, the semiconductor layer 310 may include one of indium-gallium-zinc-oxide (IGZO), indium-zinc-oxide (IZO), indium-gallium-tin-oxide (IGTO), and indium-gallium-oxide (IGO).

The gate insulating layer 320 may be formed on the semiconductor layer 310 to insulate the gate electrode 330 from the semiconductor layer 310. The gate insulating layer 320 of the thin film transistor 300 may include silicon nitride (SINx) or silicon oxide (SiOx). In addition, the gate insulation layer 320 is shown as a single layer, but may be formed of a multi-layer.

The gate electrode 330 of the thin film transistor 300 may be formed on the gate insulating layer 320. The gate electrode 330 may be formed on the gate insulating layer 320 to overlap the channel area of the semiconductor layer 310.

The interlayer insulating layer 400 may be formed on the gate insulating layer 320 and the gate electrode 430 of the thin film transistor 300. The interlayer insulating layer 400 may include an organic insulating material such as acryl resin, epoxy resin, phenolic resin, polyamide resin or polyimide resin.

A contact hole for exposing the semiconductor layer 310 of the thin film transistor 300 may be formed in the gate insulating layer 320 of the thin film transistor 300 and the interlayer insulating layer 400.

The source electrode 341 and the drain electrode 342 of the thin film transistor 300 may be formed on the interlayer insulating layer 400 while facing each other. In addition, each of the source electrode 341 and the drain electrode 342 of the thin film transistor 300 may be connected to the semiconductor layer 310 through a contact hole formed in the gate insulating layer 320 and the interlayer insulating layer 400.

Although not shown, the drain electrode 342 of the thin film transistor 300 may be electrically connected to the blocking layer 150. Therefore, the blocking layer 150 made of a conductive material may be electrically stabilized, and it is possible to prevent the blocking layer 150 from disturbing a normal operation of the semiconductor layer 310.

The planarization layer 450 may be formed on the thin film transistor 300 to compensate for a step difference due to the thin film transistor 300 and the contact holes. The planarization layer 450 may include an inorganic insulating material such as a silicon oxide layer (SiOX) and a silicon nitride layer (SiNX). Alternatively, the planarization layer 450 may include an organic insulating material such as acryl resin, epoxy resin, phenolic resin, polyamide resin or polyimide resin.

The light emitting element 500 may be formed on the planarization layer 450. The light emitting element 500 may include a first electrode 510, a light emitting layer 520 and a second electrode 530.

The first electrode 510 may be formed on the planarization layer 450. The first electrode 510 may be formed in each of the subpixels P, and may function as an anode of the display device. The first electrode 510 may be electrically connected to the thin film transistor 300.

The first electrode 510 may include a transparent conductive material. For example, the first electrode 510 may include a transparent conductive material such as Indium Tin Oxide (ITO) and Indium Zinc Oxide (IZO). Alternatively, the first electrode 510 may include a metal material such as Al, Ag, Cu, Mo, Ti, W and Cr, or their alloy. In addition, the first electrode 510 is shown as a single layer, but may be formed as a multi-layer. For example, the first electrode 510 may be formed as a triple layer in which a transparent conductive material, a metal material and a transparent conductive material are sequentially stacked.

The bank 600 may be formed on the first electrode 510. The bank 600 may be formed at a boundary between the respective subpixels P and a boundary between the display area AA and the non-display area NA to cover an end of the first electrode 510.

The bank 600 may include an organic insulating material such as acryl resin, epoxy resin, phenolic resin, polyamide resin and polyimide resin. Alternatively, the bank 600 may include an inorganic insulating material such as silicon nitride, aluminum nitride, zirconium nitride, titanium nitride, hafnium nitride, tantalum nitride, silicon oxide, aluminum oxide or titanium oxide. In addition, the bank 600 may be formed to include a black dye to absorb light incident from the outside.

The light emitting layer 520 may be formed on the first electrode 510. In addition, the light emitting layer 520 may be also formed on the bank 600 and thus may be continuously formed in the plurality of sub pixels P and a boundary area therebetween.

The light emitting layer 520 may include a first light emitting layer 521 and a second light emitting layer 522.

The first light emitting layer 521 may be formed on the first electrode 510 by a solution process. Since the first light emitting layer 521 is formed through a solution process, its end may have a round shape. That is, a side of the first light emitting layer 521, which is adjacent to the bank 600, may have a round shape.

Referring to FIG. 3, the first light emitting layer 521 may include a hole injection layer (HIL) 521a, a hole transport layer (HTL) 521b and a light emitting material layer (EML) 521c. The hole injection layer (HIL) 521a may inject holes, and the hole transport layer (HTL) 521b may transport holes. In addition, the light emitting material layer (EML) 521c may emit light of a color corresponding to each subpixel. For example, when the subpixel emits any one of red, green or blue light, the light emitting material layer (EML) 521c may emit any one of red, green or blue light.

The second light emitting layer 522 may be formed on the first light emitting layer 521 through a deposition process. The second light emitting layer 522 may be also formed on the bank 600 and thus may be continuously formed in the boundary area of the subpixels. In addition, the second light emitting layer 522 may be formed to include an electron transport layer ETL for transporting electrons.

At this time, the first light emitting layer 521 formed by the solution process may have a round shape on the side adjacent to the bank 600. In detail, when the solution constituting the first light emitting layer 521 is dried in the process step, an evaporation speed of a solvent coated on the area adjacent to the bank 600 may be faster than that of a solvent coated on the other area. Therefore, a height of the first light emitting layer 521 in a portion adjacent to the bank 600 becomes higher as the first light emitting layer 521 approaches the bank 600. In addition, since the second light emitting layer 522 is formed by a deposition process, the second light emitting layer 522 may be formed to have a uniform thickness. In this case, the second light emitting layer 522 may be formed on the first light emitting layer 521 along a shape of an upper surface of the first light emitting layer 521. That is, like the first light emitting layer 521, the second light emitting layer 522 may have a round shape on the side adjacent to the bank 600. In addition, an area of the second light emitting layer 522, which is overlapped with a flat upper surface of the bank 600, may be flat.

Therefore, the present disclosure may disclose the light emitting layer 520 that includes a first light emitting layer 521 formed through a solution process and a second light emitting layer 522 formed through a deposition process.

The second electrode 530 may be formed on the light emitting layer 520. The second electrode 530 may function as a cathode of the display device. Like the light emitting layer 520, the second electrode 530 may be formed in the subpixels and the boundary area therebetween. That is, the second electrode 530) may be also formed on the bank 600.

Since the display device according to one aspect of the present disclosure is provided in a top emission method, the second electrode 530 may include a transparent conductive material such as Indium Tin Oxide (ITO) or Indium Zinc Oxide (IZO) to transmit the light emitted from the light emitting layer 520 toward an upper portion. The second electrode 530 may be formed of a single layer or multi-layer.

The encapsulation layer 700 may be formed on the second electrode 530 to prevent external moisture from being permeated into the light emitting layer 520. The encapsulation layer 700 may be made of an inorganic insulating material such as a silicon oxide layer (SiOx) and a silicon nitride layer (SiNx). Alternatively, the encapsulation layer 700 may include an organic insulating material such as acryl resin, epoxy resin, phenolic resin, polyamide resin or polyimide resin.

Although not shown, a color filter and an absorption film may be formed on the encapsulation layer 700. The floor filter may emit light of a color corresponding to each subpixel, and the absorption film may minimize luminance reduction while preventing external light from being introduced.

The ground line 30 may be formed in the non-display area NA. As described above, the ground line 30 may be made of a conductive material, and may be disposed on the substrate 100. In addition, the ground line 30 may include a plurality of lines formed in a horizontal direction and a vertical direction, crossing each other. In addition, the ground line 30 may be formed on the same layer as the blocking layer 150, but is not limited thereto. In addition, the ground line 30 may be formed of the same material through the same process as the blocking layer 150, but is not limited thereto.

The buffer layer 200, the gate insulating layer 320, the interlayer insulating layer 400, the planarization layer 450 and the encapsulation layer 700 may be sequentially formed on the ground line 30.

Figure 4:
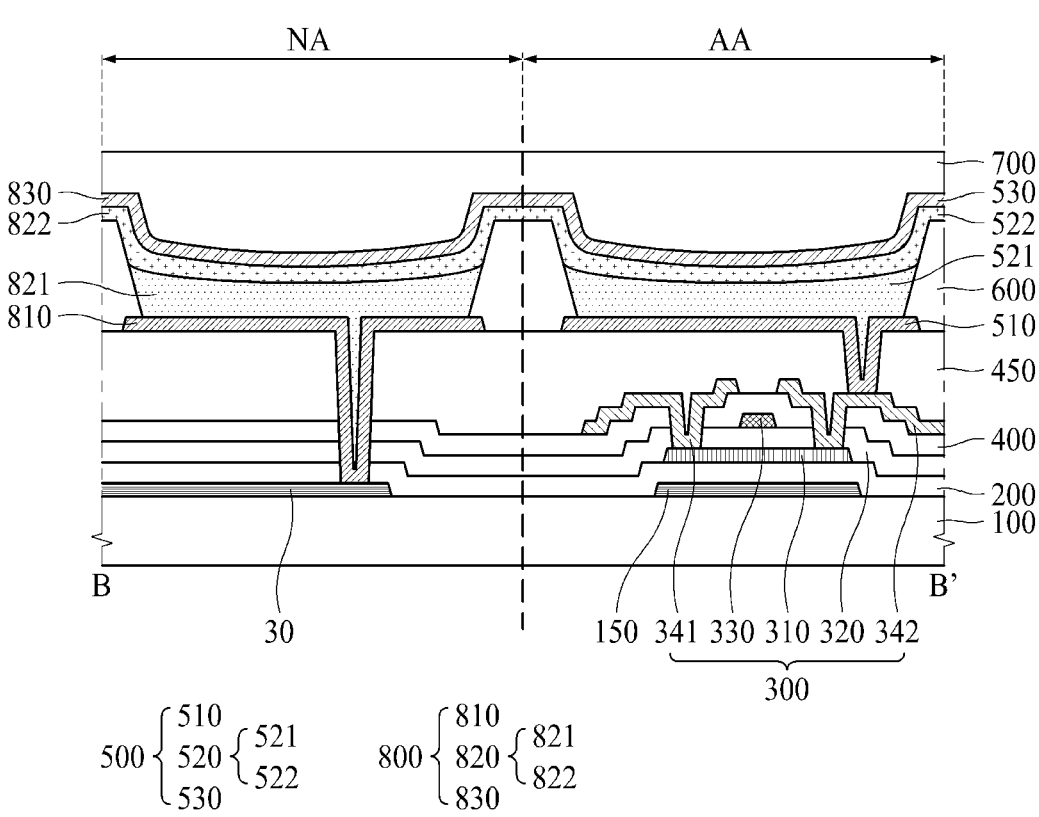
FIG. 4 is a cross-sectional view taken along line B-B' of a display device according to an aspect of the present disclosure.
Figure 5A:
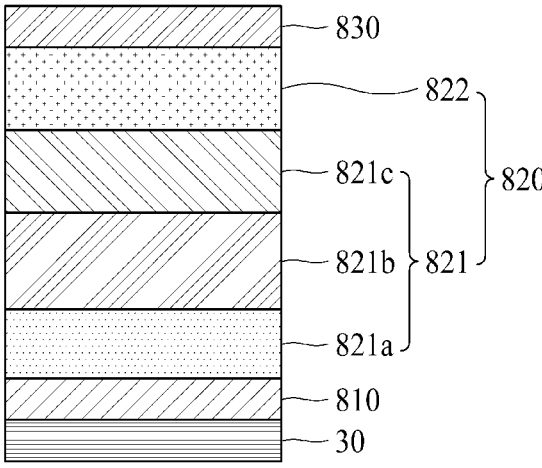
FIGS. 5A, 5B and 5C are cross-sectional views illustrating various stacked structures of a sub-diode of a display device according to the present disclosure.
Figure 5B:
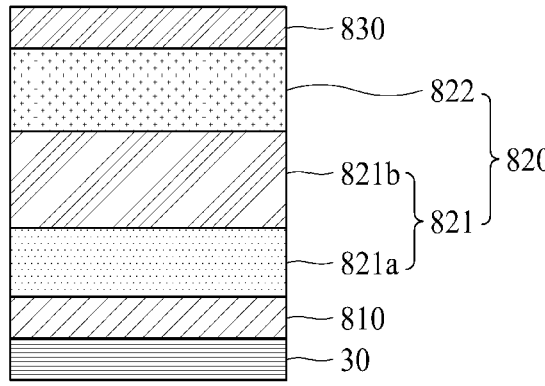
Figure 5C:
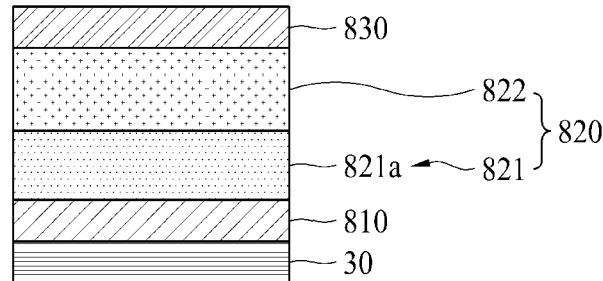

FIG. 4 is a cross-sectional view taken along line B-B' of a display device according to one aspect of the present disclosure, and FIGS. 5A, 5B and 5C are cross-sectional views illustrating various stacked structures of a sub-diode 800 of a display device according to the present disclosure. FIG. 4 is the same as FIG. 2 except for the configuration of the anti-electrostatic discharge portion 40 and thus a redundant description will be omitted.

The anti-electrostatic discharge portion 40 may be formed on the substrate 100 in the non-display area NA. The anti-electrostatic discharge portion 40 may include a ground line 30 and a sub-diode 800.

As described above, the ground line 30 is made of a conductive material, and may be disposed on the substrate 100. In addition, the ground line 30 may include a plurality of lines formed in a horizontal direction and a vertical direction and connected to each other while crossing each other. In addition, the ground line 30 may be formed on the same layer as the blocking layer 150, but is not limited thereto. In addition, the ground line 30 may be formed of the same material through the same process as that of the blocking layer 150, but is not limited thereto.

The buffer layer 200, the gate insulating layer 320, the interlayer insulating layer 400 and the planarization layer 450 may be sequentially formed on the ground line 30.

The sub-diode 800 may be formed on the planarization layer 450. In addition, the sub-diode 800 may be formed to overlap the ground line 30. The sub-diode 800 may include a first sub-electrode 810, an organic layer 820 and a second sub-electrode 830.

The first sub-electrode 810 may be formed on the planarization layer 450. In addition, the first sub-electrode 810 may be electrically connected to the ground line 30 through a contact hole formed on the ground line 30.

The first sub-electrode 810 may include a transparent conductive material. For example, the first sub-electrode 810 may include a transparent conductive material such as Indium Tin Oxide (ITO) or Indium Zinc Oxide (IZO). Alternatively, the first sub-electrode 810 may include a metal material such as Al, Ag, Cu, Mo, Ti, W and Cr, or their alloy. In addition, the first-sub electrode 810 is shown as a single layer, but may be formed as a multi-layer. For example, the first-sub electrode 810 may be formed as a triple layer in which a transparent conductive material, a metal material and a transparent conductive material are sequentially stacked. In addition, the first sub-electrode 810 may be formed of the same material through the same process as that of the first electrode 510 of the light emitting element 500, but is not limited thereto.

The bank 600 may be formed on the first-sub electrode 810. That is, the bank 600 may be formed at the boundary between the display area AA and the non-display area NA and an outer area of the non-display area NA to cover an end of the first-sub electrode 810.

The organic layer 820 may be formed on the first-sub electrode 810. In addition, the organic 820 may be also formed on the bank 600.

The organic layer 820 may include a first organic layer 821 and a second organic layer 822.

The first organic layer 821 may be formed on the first-sub electrode 810 by a solution process. Since the first organic layer 821 is formed through a solution process, its end may have a round shape. That is, a side of the first organic layer 821, which is adjacent to the bank 600, may have a round shape.

Referring to FIGS. 5A to 5C, the first organic layer 821 may be formed in various stacked structures. Referring to FIG. 5A, the first organic layer 821 may be formed in the same stacked structure as that of the first light emitting layer 521 of the light emitting element 500. In detail, the first organic layer 821 may include a hole injection layer (HIL) 821a, a hole transport layer (HTL) 821b and a light emitting material layer (EML) 821c. Therefore, since the elements of the sub-diode 800 may be formed together through the process of the light emitting element 500, the process steps may be simplified.

Alternatively, the first organic layer 821 may be formed in a stacked structure different from that of the first light emitting layer 521 of the light emitting element 500. Referring to FIG. 5B, the first organic layer 821 may include only the hole injection layer (HIL) 821a and the hole transport layer (HTL) 821b. Alternatively, referring to FIG. 5C, the first organic layer 821 may include only the hole injection layer (HIL) 821a, but is not limited thereto. Therefore, a turn-on voltage of the sub-diode 800 may be adjusted by changing the structure of the first organic layer 821.

The second organic layer 822 may be formed on the first organic layer 821 through a deposition process. The second organic layer 822 may be also formed on the bank 600 and thus may be formed to be in contact with the second light emitting layer 522. In addition, the second organic layer 822 may be formed to include an electron transport layer ETL for transporting electrons. That is, since the second organic layer 822 is formed in the same structure as that of the second light emitting layer 522 of the light emitting element 500, the second organic layer 822 and the second light emitting layer 522 may be continuously formed in the boundary area between the display area AA and the non-display area NA.

At this time, the first organic layer 821 formed by the solution process may have a round shape on the side adjacent to the bank 600. In detail, when the solution constituting the first organic layer 821 is dried in the process step, an evaporation speed of a solvent coated on the area adjacent to the bank 600 may be faster than that of a solvent coated on the other area. Therefore, a height of the first organic layer 821 in a portion adjacent to the bank 600 becomes higher as the first organic layer 821 approaches the bank 600. In addition, since the second organic layer 822 is formed by a deposition process, the second organic layer 822 may be formed to have a uniform thickness. In this case, the second organic layer 822 may be formed on the first organic layer 821 along a shape of an upper surface of the first organic layer 821. That is, like the first organic layer 821, the second organic layer 822 may have a round shape on the side adjacent to the bank 600. In addition, an area of the second organic layer 822, which is overlapped with a flat upper surface of the bank 600, may be flat.

The second sub-electrode 830 may be formed on the organic layer 820. The second sub-electrode 830 is formed on the bank 600 and thus may be formed to be in contact with the second electrode 530. In this case, since the second sub-electrode 830 is made of the same material as that of the second electrode 530, the second sub-electrode 830 and the second electrode 530 may be considered to be continuously formed in the boundary area between the display area AA and the non-display area NA.

Therefore, in the present disclosure, the sub-diode 800 electrically connected to the ground line 30 may be formed so that external static electricity may be easily discharged. In detail, when external static electricity is introduced through the ground line 30, external static electricity may be sequentially transferred to the first sub-electrode 810, the organic layer 820 and the second sub-electrode 830 of the sub-diode 800. Since the second sub-electrode 830 is continuously formed with the second electrode 530 of the light emitting element 500, external static electricity may be transferred to the second electrode 530. Since the second electrode 530 is formed on an entire surface of the display area AA, external static electricity may be quickly dispersed to the entire surface of the display area AA. Therefore, external static electricity is transferred to the second electrode 530 through the sub-diode 800 and thus easily discharged, whereby a defect of the thin film transistor 300 due to external static electricity may be avoided.

Figure 6:
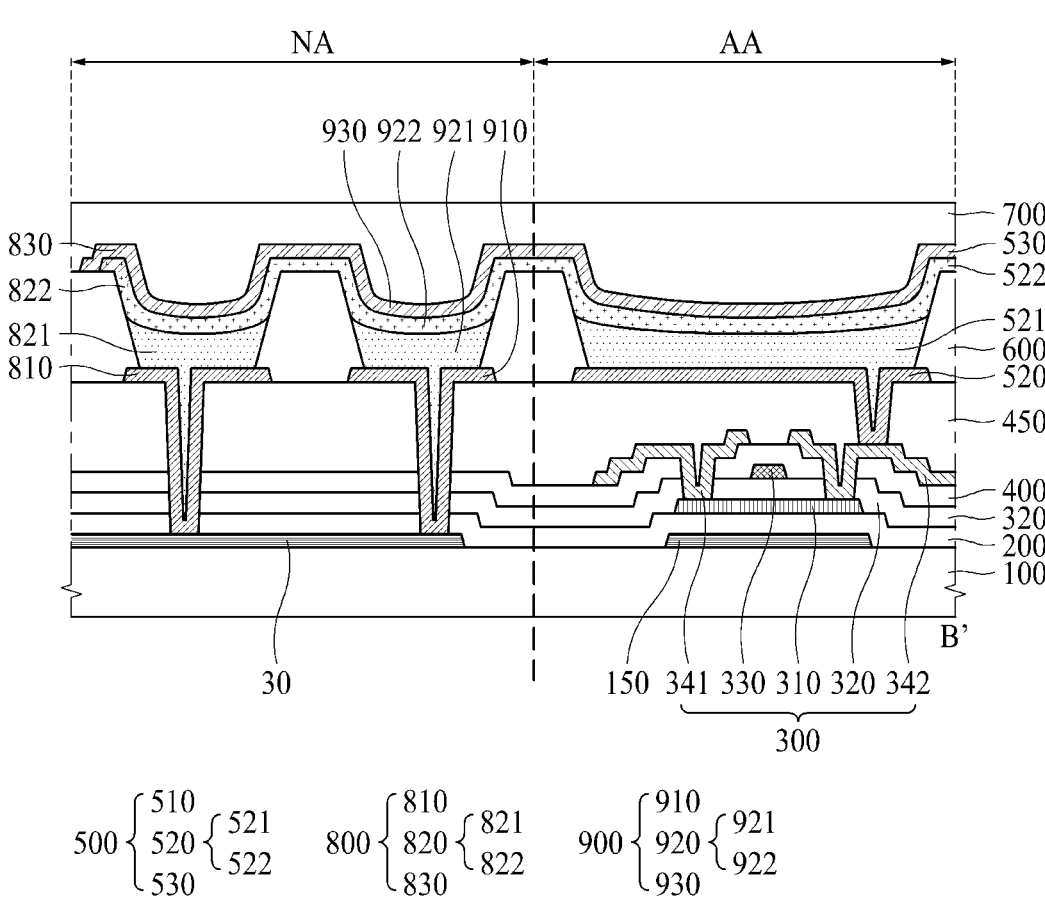
FIG. 6 is a cross-sectional view taken along line B-B' of a display device according to another aspect of the present disclosure.

FIG. 6 is a cross-sectional view taken along line B-B' of a display device according to another aspect of the present disclosure. FIG. 6 is the same as FIG. 4 except for the configuration of the anti-electrostatic discharge portion 40, and thus a redundant description will be omitted.

As described above, the anti-electrostatic discharge portion 40 may be formed on the substrate 100 in the non-display area NA. In this case, the anti-electrostatic discharge portion 40 may include a plurality of sub-diodes. Referring to FIG. 6, the anti-electrostatic discharge portion 40 may include a ground line 30 and first and second sub-diodes 800 and 900. The first and second sub-diodes 800 and 900 are disclosed in FIG. 6, but the present disclosure is not limited thereto. For example, the anti-electrostatic discharge portion 40 may include three or more sub-diodes.

As described above, the ground line 30 is made of a conductive material, and may be disposed on the substrate 100. In addition, the ground line 30 may include a plurality of lines formed in a horizontal direction and a vertical direction and connected to each other while crossing each other.

The buffer layer 200, the gate insulating layer 320, the interlayer insulating layer 400 and the planarization layer 450 may be sequentially formed on the ground line 30.

The first and second sub-diodes 800 and 900 may be formed on the planarization layer 450. In addition, the first and second sub-diodes 800 and 900 may be formed to overlap the ground line 30 and to be spaced apart from each other by the bank 600. As described above, the first and second sub-diodes 800 and 900 may include first sub-electrodes 810 and 910, organic layers 820 and 920, and second sub-electrodes 830 and 930, respectively.

The first sub-electrodes 810 and 910 may be formed on the planarization layer 450. In addition, the first sub-electrodes 810 and 910 may be electrically connected to the ground line 30 through a contact hole formed on the ground line 30. In addition, the first sub-electrodes 810 and 910 may be formed of the same material through the same process as that of the first electrode 510 of the light emitting element 500, but are not limited thereto.

The bank 600 may be formed on the first-sub electrodes 810 and 910. That is, the bank 600 may be formed at a boundary between the first and second sub-diodes 800 and 900 and in the outer area of the non-display area NA to cover ends of the first-sub electrodes 810 and 910.

As described above, the organic layers 820 and 920 may be formed on the first sub-electrodes 810 and 910. In addition, the organic layers 820 and 920 may be also formed on the bank 600. The organic layers 820 and 920 may include first organic layers 821 and 921 and second organic layers 822 and 922, respectively.

Like the first light emitting layer 521 of the light emitting element 500, the first organic layers 821 and 921 may be also formed by a solution process. Therefore, like the first light emitting layer 521 of the light emitting element 500, the first organic layers 821 and 921 may have a round shape on the side adjacent to the bank 600. In detail, when the solution constituting the first organic layers 821 and 921 is dried during the process step, the evaporation speed of the solvent coated on the area adjacent to the bank 600 may be faster than that of the solvent coated on the other area. Therefore, heights of the first organic layers 821 and 921 become higher as the first organic layers 821 and 921 approach the bank 600.

At this time, the first organic layer 821 of the first sub-diode 800 and the first organic layer 921 of the second sub-diode 900 may be formed in the same stacked structure. In detail, the first organic layer 821 of the first sub-diode 800 and the first organic layer 921 of the second sub-diode 900 may include hole injection layers (HIL) 821*a* and 921*a*, hole transport layers (HTL) 821*b* and 921*b*, and light emitting material layers (EML) 821*c* and 921*c*, respectively. Therefore, since the first and second sub-diodes 800 and 900 may be formed together through the process of the light emitting element 500, the process steps may be simplified.

Alternatively, the first organic layer 821 of the first sub-diode 800 and the first organic layer 921 of the second sub-diode 900 may be formed in their respective stacked structures different from each other. For example, the first organic layer 821 of the first sub-diode 800 may be formed to include a hole injection layer (HIL) 821*a*, a hole transport layer (HTL) 821*b*, and a light emitting material layer (EML)

821c, and the first organic layer 921 of the second sub-diode 900 may be formed to include only a hole injection layer (HIL) 921a and a hole transport layer (HTL) 921b. Also, each structure of the first organic layer 821 of the first sub-diode 800 and the first organic layer 921 of the second sub-diode 900 may be any one stacked structure shown in FIGS. 5A to 5C, but is not limited thereto.

Conventionally, the turn-on voltage of the diode may be adjusted by changing the structure and thickness of the organic layer in view of characteristics of the diode. Therefore, when the first organic layer 821 of the first sub-diode 800 and the first organic layer 921 of the second sub-diode 900 are formed in their respective structures different from each other, the first and second sub-diodes 800 and 900 may be formed to have their respective turn-on voltages different from each other. In this case, when external static electricity is introduced through the ground line 30, even though any one of which has a low turn-on voltage, of the first and second sub-diodes 800 and 900 is damaged, the other sub-diode may be normally driven. Therefore, even though external static electricity is introduced multiple times, external static electricity may be easily discharged without damage to the thin film transistor 300.

The second organic layers 822 and 922 may be formed on the first organic layers 821 and 921. The second organic layers 822 and 922 may be also formed on the bank 600 and thus may be formed to be in contact with the second light emitting layer 522. In addition, the second organic layers 822 and 922 may be formed to include an electron transport layer ETL for transporting electrons. That is, since the second organic layer 822 of the first sub-diode 800 and the second organic layer 922 of the second sub-diode 900 are formed in the same structure, the layers may be seen as being continuously formed in the boundary area between the first and second sub-diodes 800 and 900. That is, the second organic layer 822 of the first sub-diode 800 and the second organic layer 922 of the second sub-diode 900 may be seen as being continuously formed together with the second light emitting layer 522 of the light emitting element 500.

In addition, like the second light emitting layer 522 of the light emitting element 500, the second organic layers 822 and 922 may be formed by a deposition process and thus may be formed to have a uniform thickness. In this case, on the first organic layers 821 and 921, the second organic layers 822 and 922 may be formed along the shape of the upper surface of the first organic layers 821 and 921. That is, like the first organic layers 821 and 921, the second organic layers 822 and 922 may have a round shape on the side adjacent to the bank 600. In addition, an area of the second organic layers 822 and 922, which is overlapped with the flat upper surface of the bank 600, may be flat.

The second sub-electrodes 830 and 930 may be formed on the organic layers 820 and 820. In this case, since the second sub-electrode 830 of the first sub-diode 800 and the second sub-electrode 930 of the second sub-diode 900 are made of the same material, the second sub-electrode 830 of the first sub-diode 800 and the second sub-electrode 930 of the second sub-diode 900 may be seen as being continuously formed in the boundary area between the first and second sub-diodes 800 and 900. That is, the second sub-electrode 830 of the first sub-diode 800 and the second sub-electrode 930 of the second sub-diode 900 may be seen as being continuously formed together with the second electrode 530 of the light emitting element 500.

Therefore, referring to FIG. 5 in comparison with FIG. 4, in the present disclosure, the second sub-diode 900 may be additionally formed, whereby external static electricity may be easily discharged. In particular, the structure of the organic layer 920 of the second sub-diode 900 is formed to be different from that of the organic layer 820 of the first sub-diode 800, so that the turn-on voltage of the sub-diode 800 may be adjusted to prevent static electricity having various sizes of voltages from occurring.

According to the present disclosure, the following advantageous effects may be obtained.

According to the present disclosure, the sub-diode connected to the ground line may be formed, so that external static electricity may be dispersed.

It will be apparent to those skilled in the art that the present disclosure described above is not limited by the above-described aspects and the accompanying drawings and that various substitutions, modifications and variations may be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:
a substrate including a display area in which a plurality of subpixels are disposed and a non-display area surrounding the display area;
an external line and a first sub-diode, which are disposed in the non-display area; and
a light emitting element formed in each of the plurality of subpixels,
wherein the first sub-diode includes a first sub-electrode, an organic layer and a second sub-electrode,
the light emitting element includes a first electrode, a light emitting layer and a second electrode,
the first sub-electrode is connected to the external line, and
the second sub-electrode is connected to the second electrode.

2. The display device of claim 1, wherein the organic layer includes a first organic layer and a second organic layer disposed on the first organic layer,
the first organic layer includes at least one of a hole injection layer, a hole transport layer and a light emitting material layer, and
the second organic layer includes an electron transport layer.

3. The display device of claim 2, wherein the light emitting layer includes a first light emitting layer and a second light emitting layer disposed on the first light emitting layer,
the first light emitting layer has a same structure as the first organic layer, and
the second light emitting layer has a same structure as the second organic layer.

4. The display device of claim 2, wherein the light emitting layer includes a first light emitting layer and a second light emitting layer disposed on the first light emitting layer,
the first light emitting layer has a structure different from the first organic layer, and
the second light emitting layer has a same structure as the second organic layer.

5. The display device of claim 2, wherein the light emitting layer includes a first light emitting layer and a second light emitting layer disposed on the first light emitting layer, the first organic layer and the first light emitting layer are formed by a solution process, and the second organic layer and the second light emitting layer are formed by a deposition process.

6. The display device of claim 5, further comprising a bank surrounding each of the first organic layer and the first light emitting layer, wherein each of the first organic layer and the first light emitting layer has a round shape on a side adjacent to the bank, and each of the second organic layer and the second light emitting layer is formed along a shape of an upper surface of the first organic layer and the first light emitting layer.

7. The display device of claim 2, further comprising a second sub-diode formed in the non-display area, wherein the second sub-diode includes a first sub-electrode, an organic layer and a second sub-electrode, the first sub-electrode of the second sub-diode is connected to the external line, and the second sub-electrodes of the first and second sub-diodes are connected to each other.

8. The display device of claim 7, wherein the first organic layers of the first and second sub-diodes have structures different from each other, and the second organic layers of the first and second sub-diodes have a same structure.

9. The display device of claim 7, wherein the first organic layers of the first and second sub-diodes have a same structure, and the second organic layers of the first and second sub-diodes have a same structure.

10. The display device of claim 1, wherein the light emitting layer and the organic layer are continuously formed in the display area and the non-display area.

11. The display device of claim 1, wherein the external line is disposed to surround outside of the non-display area, and is formed in a mesh shape.

12. The display device of claim 11, wherein the external line is connected to a ground voltage.

* * * * *